United States Patent
Ferguson

(10) Patent No.: US 7,584,235 B2
(45) Date of Patent: Sep. 1, 2009

(54) VARIABLE PASSBAND AUTOREGRESSIVE MOVING AVERAGE FILTER

(75) Inventor: Kevin M. Ferguson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 602 days.

(21) Appl. No.: 10/804,663

(22) Filed: Mar. 18, 2004

(65) Prior Publication Data

US 2005/0210092 A1 Sep. 22, 2005

(51) Int. Cl.
*G06F 17/10* (2006.01)
(52) U.S. Cl. .................... 708/300; 708/319; 702/189; 702/190
(58) Field of Classification Search ............... 708/300, 708/319; 702/189, 190
See application file for complete search history.

(56) References Cited

U.S. PATENT DOCUMENTS

| | | | | | |
|---|---|---|---|---|---|
| 5,325,318 | A | * | 6/1994 | Harris et al. | 708/313 |
| 5,337,264 | A | * | 8/1994 | Levien | 708/300 |
| 5,796,637 | A | * | 8/1998 | Glew et al. | 702/190 |
| 5,987,487 | A | * | 11/1999 | Welland | 708/491 |

* cited by examiner

*Primary Examiner*—Lewis A Bullock, Jr.
*Assistant Examiner*—Michael Yaary
(74) *Attorney, Agent, or Firm*—Francis I. Gray

(57) ABSTRACT

A variable passband ARMA filter has as inputs a signal to be filtered, a reverse version of the signal to be filtered and a variable coefficient to produce as an output a filtered signal. The variable coefficient is generated by a variable equivalent sample rate coefficient converter having as inputs an initial coefficient and a variable resampling rate parameter which controls the passband.

5 Claims, 6 Drawing Sheets

VARIABLE PASSBAND AUTOREGRESSIVE MOVING AVERAGE FILTER

BACKGROUND OF THE INVENTION

The present invention relates to filter designs, and more particularly to a variable passband autoregressive moving average (ARMA) filter using a non-causal filter design.

A problem common to several signal processing applications, including radio frequency (RF) tuning, audio tone controls, variable transient filtering, sampling rate conversion, jitter/wander compensation and/or measurement and the like, is that a zero-pole based digital filter, such as an infinite impulse response (IIR) and finite impulse response (FIR) combination, needs to have a variable frequency response at a given sample rate, or vice versa—constant frequency response at a variable sampling rate. In video there is such a need for a variable bandwidth video luminance filter in order to reduce sensitivity of transients seen by a signal out-of-range detector/alarm. Such a filter needs to have a nominal lowpass response, as given by IEEE-P205, and via one control parameter continuous range from full bandwidth to some small fraction of nominal bandwidth. An additional requirement is that the filter needs to have greater computational efficiency—faster/less expensive—than existing filter methods in order to have realtime performance in a video waveform monitor, for example.

Prior digital variable bandwidth filters include the use of:

1) either only FIR or only IIR filters;
2) analog filter simulation with variable C, L, R, gyrator, etc.;
3) discrete bandwidth selection of ARMA design.

The first class satisfies the continuously variable bandwidth requirement, but generally requires more computation to approximate a pole with many zeroes and vice versa. The second class also satisfies the continuously variable bandwidth requirement, but generally does not work well when the cut-off frequency approaches Nyquist—at which point instability may take place for higher order filters or extra processing may be required to prevent it. Also in the second class mapping the passband control parameter to new filter component values is not always readily apparent or may be difficult or impractical to implement. The third class does not satisfy the continuously variable bandwidth requirement.

What is desired is a stable, continuously variable bandwidth controllable via one parameter, digital filter for processing signals from full bandwidth to a small portion of the bandwidth.

BRIEF SUMMARY OF THE INVENTION

Accordingly the present invention provides a variable passband autoregressive moving average (ARMA) filter having as inputs a signal to be filtered, a reverse version of the signal to be filtered and a variable coefficient to produce as an output a filtered signal. The variable coefficient is generated by a variable equivalent sample rate coefficient converter (VESRCC) having as inputs an initial coefficient and a variable resampling rate parameter which controls the passband.

The objects, advantages and other novel features of the present invention are apparent from the following detailed description when read in conjunction with the appended claims and attached drawing.

DETAILED DESCRIPTION OF THE INVENTION

Figure 1:
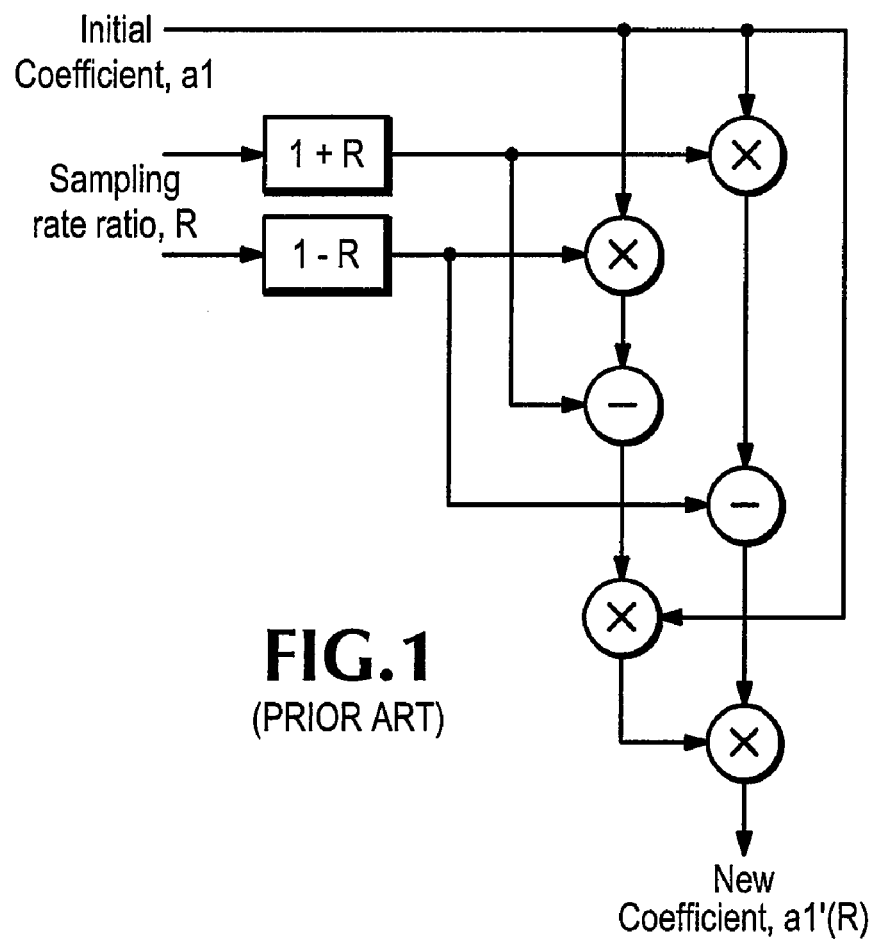
FIG. 1 is a block diagram view of a variable "equivalent sample rate" coefficient converter for use in the present invention.
Figure 2:
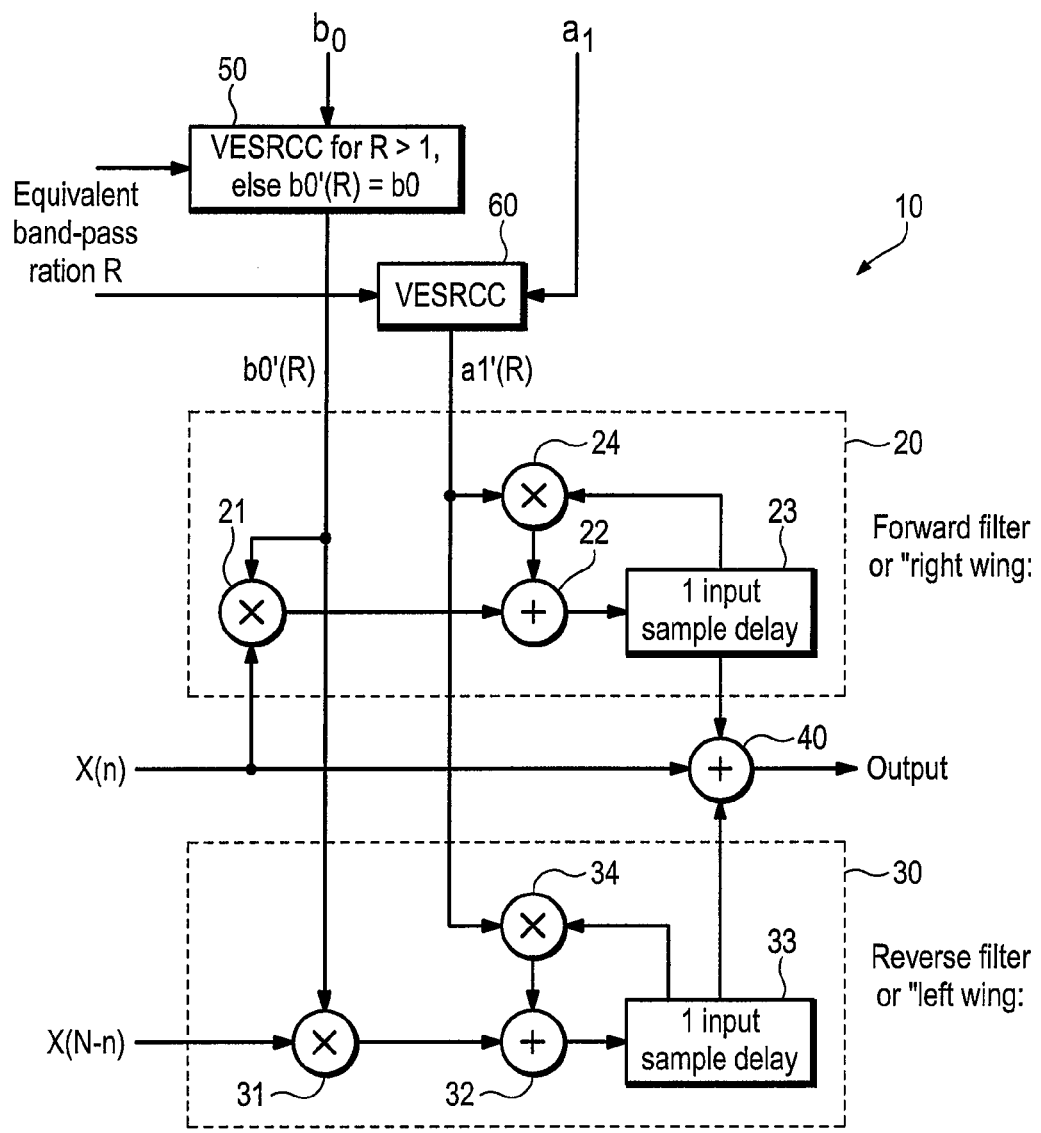
FIG. 2 is a block diagram view of an implementation of a variable passband ARMA filter according to the present invention.

The present invention is close to the second class of filter discussed above using an ARMA design. A variable equivalent sample rate recursive coefficient converter (VESRCC), shown in FIG. 1 and described in more detail in U.S. Pat. No. 6,976,045, issued on Dec. 30, 2005 to Kevin Ferguson and entitled "Variable Sample Rate Recursive Digital Filter", is used which takes advantage of the bilinear transform to shift the poles of the IIR filters. Referring now to FIG. 2 a variable passband ARMA filter 10 is shown that meets the IEEE P205 luminance filter specification (IEEE G 2.1.4/98-07: "IEEE P205 Draft Standard on Television Measurement of Luminance Signal Levels"). The architecture shown uses a sum of weighted first order IIR filters, similar to the "seagull" architecture disclosed in co-pending U.S. patent application Ser. No. 10/802,305 filed Mar. 17, 2004 by Kevin Ferguson and entitled "UpSampling Half-Band Reconstruction Filtering". X(n) represents an input signal (forward signal), and X(N-n) represents a reversed version of the input signal (reverse signal). The forward signal is input to a first IIR filter 20, the reverse signal is input to a second IIR filter 30 in parallel with the first IIR filter, and the outputs from the two filters are combined with the input signal in a summing circuit 40. The variable coefficients for the ARMA filter 10 are derived from initial filter values, $b_0$ and $a_1$, via respective VESRCC circuits 50, 60, to which also are input an equivalent passband ratio, R. By varying the parameter R a continuous range from full bandwidth to some small fraction of nominal bandwidth is achieved.

Each IIR filter 20, 30 has an input gain stage in the form of an input multiplier 21, 31 to which the gain coefficient from an asymmetric VESRCC circuit 50 is input. The second stage is a decay stage where the output from the input multiplier 21, 31 is input to a summer 22, 32, the output of which is input to a delay circuit 23, 33 that provides the output of the summer delayed by one sample time as the filter 20, 30 output. The output from the delay circuit 23, 33 also is input to a decay multiplier 24, 34, the output of which is the other input to the summer 22, 32. The decay coefficient from a symmetric VES-RCC circuit 60 is input to the decay multiplier 24, 34.

In an ARMA filter, such as that of FIG. 2, if the zeroes are shifted, misalignment of zero and pole related gains over frequency cause response distortions in the general case. For example, higher frequency stop band attenuation may suffer as the zero shifts lower in the frequency domain. However if for zeroes the bilinear transform based on the scaling method implemented by the VESRCC circuits 50, 60 is applied above a nominal frequency resampling rate, corresponding to a resampling rate R>1.0 in the above-mentioned U.S. Pat. No. 6,976,045, the response distortion is mitigated. Below the nominal resampling rate (R<1.0), the zeroes no longer shift, but instead are nominal. This allows the advantages of the VESRCC circuits 50, 60, as cited in the above-mentioned U.S. Pat. No. 6,976,045, while solving the problem of zero/pole gain mismatches, such as stop band attenuation reduction mentioned above. The present invention uses the asymmetric (R>1.0 only) use of the VESRCC circuit 50 on zeroes only, and the symmetric (all values of R) use of the VESRCC circuit 60 on poles.

Figure 3:
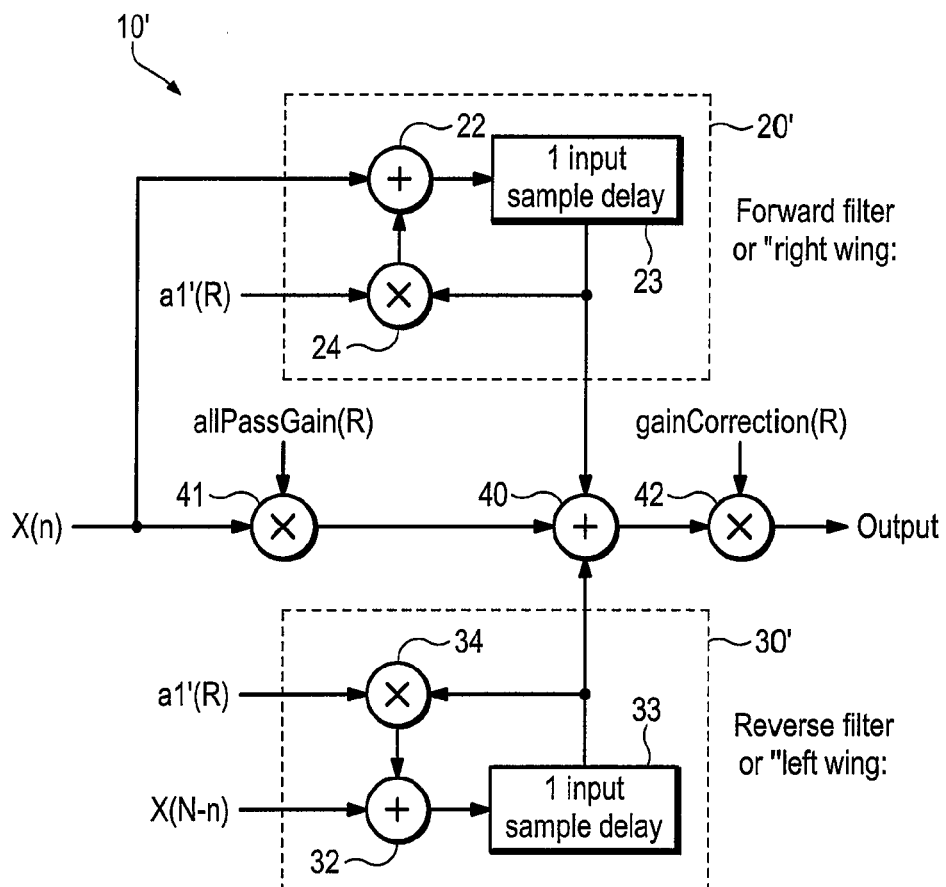
FIG. 3 is a block diagram view of the implementation of FIG. 2 with gains redistributed according to the present invention.

As shown in FIG. 2 the gain of the filter 10 is not unity, but may be made unity gain simply by adding a multiplier and appropriate gain correction at the output, as shown in FIG. 3. In this implementation the IIR filters 20', 30' only have the decay stage described above. An "all pass" multiplier 41 for the input signal replaces the individual gain multipliers 21, 31 of FIG. 2. The all pass gain coefficient input to the all pass multiplier 41 is a function of R, and the output is input to the summing circuit 40. The output from the summing circuit 40 is input to an output multiplier 42 which has a gain correction coefficient as a function of R. The output of the output multiplier 42 is the filter 10' output. The allPassGain(R)=$(1-a_1'(R))/(b_0'(R))$ to maintain the ratio of gains between the all pass portion and each IIR portion, and gainCorrection(R)= $(1-a_1'(R))/(2-allPassGain(R))$ sets the overall filter gain.

The filter design described above has resource savings advantages when implemented in either hardware, such as field programmable gate arrays (FPGAs), or in software in a digital signal processor (DSP) or general purpose computer processing unit (CPU) such as found in personal computers (PCs). Although the specific implementations shown here use a non-causal filter design, the variable rate solution may be applied to causal filters as well, thus being applicable to digital ARMA filters generally. In the non-causal version described herein, the filter design may also be applied generally to the filtering of signals for any application which processes signals in segments, records, etc. such that bidirectional filtering may be used. Thus all measurement instrument displays of plots of data, such as voltage vs. time, magnitude and phase vs. frequency, video and audio displays, etc. may use this filter design. The filter design has all the advantages of using the VERSCC circuit while maintaining passband and stop band characteristics over bandwidth control. As a result an efficient filter may be used with a relative passband control mechanism.

Figure 4A:
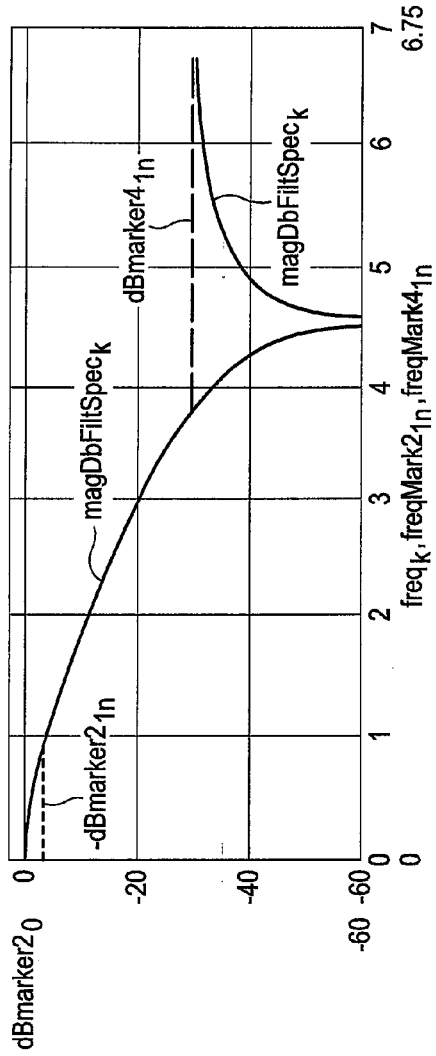
FIGS. 4a and 4b are plots of the frequency response of the ARMA filter using a first set of coefficients according to the present invention.
Figure 4B:
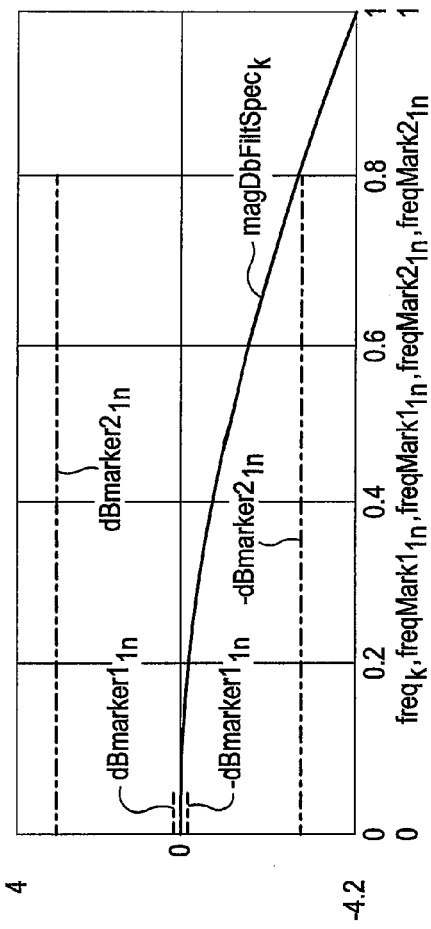

FIGS. 4a and 4b show respectively a plot of frequency response for the filter design described here with an IEEE P205 luminance filter template and the same plot zoomed in near zero dB. The coefficients for this implementation are:

$b_0=1$, $a_1=0.53$, allPassGain=1.1494253, gainCorrection=0.1850226, R=1

Figure 5A:
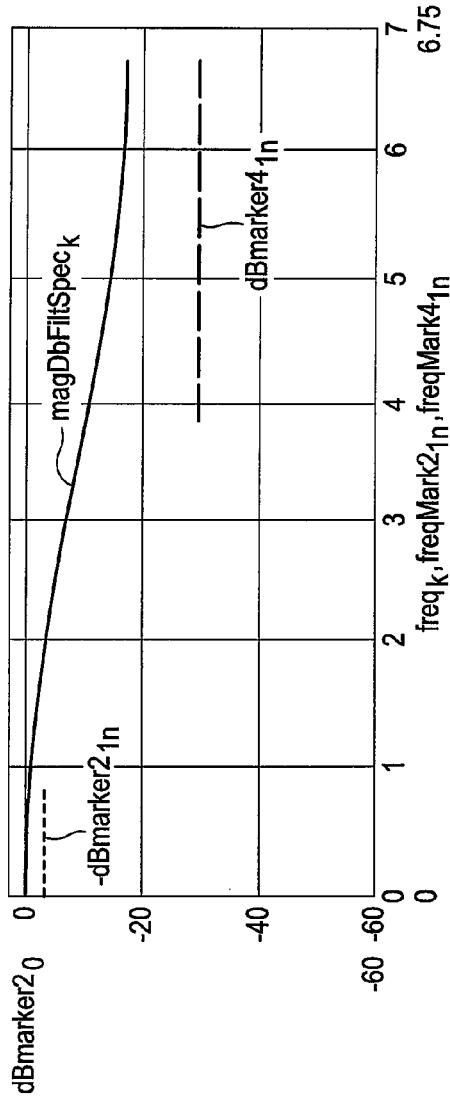
FIGS. 5a and 5b are plots of the frequency response of the ARMA filter using a second set of coefficients according to the present invention.
Figure 5B:
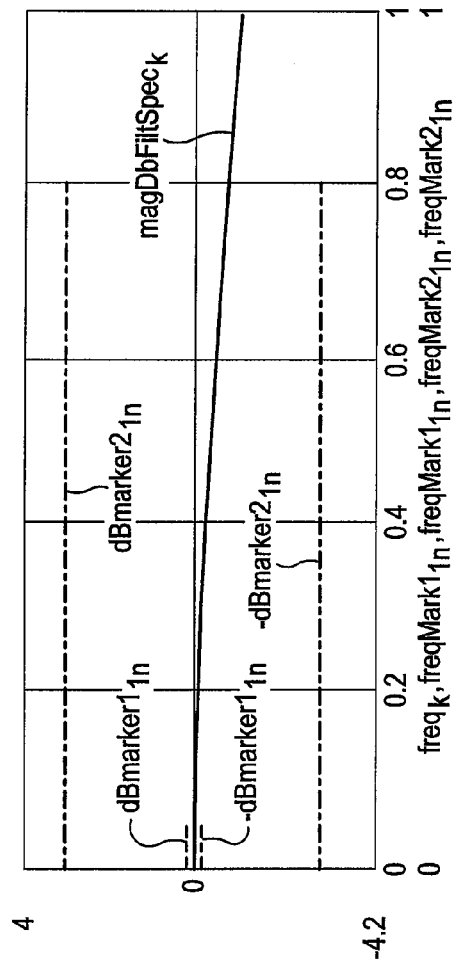

FIGS. 5a and 5b show the same plots as above, but the coefficients are (due to R=2 for double the bandwidth):

$b_0=1$, $a_1=0.2384493$, allPassGain=2.3008849, gainCorrection=0.2029589, R=2

Figure 6A:
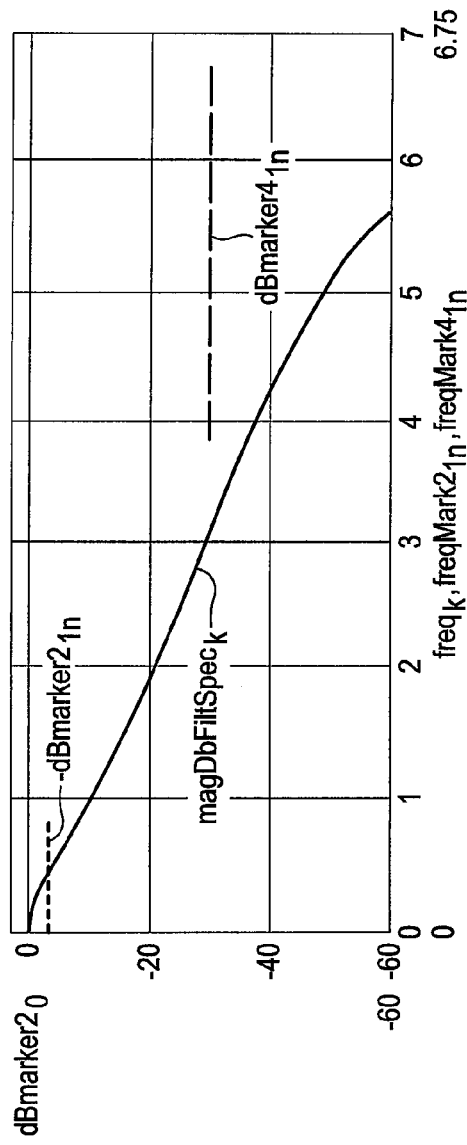
FIGS. 6a and 6b are plots of the frequency response of the ARMA filter using a third set of coefficients according to the present invention.
Figure 6B:
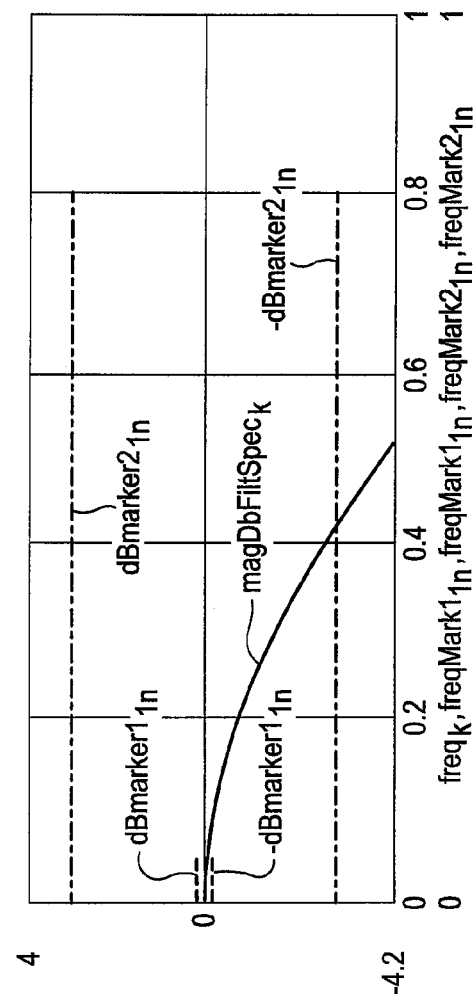

FIGS. 6a and 6b show the same plots as above, but the coefficients are (due to R=0.5 for half the bandwidth):

$b_0=1$, $a_1=0.7336897$, allPassGain=1.1494253, gainCorrection=0.1154806, R=0.5

Thus the present invention provides a variable passband ARMA filter by combining a variable equivalent sample rate coefficient converter (VESRCC) with a digital filter having a seagull architecture using parallel IIR filters, the outputs from the IIR filters being combined with the input signal to produce the filter output and the variable passband being controlled by a single sample rate parameter to generate filter coefficients from initial coefficients.

What is claimed is:

1. A filter having a variable passband comprising:
   a filter circuit having as inputs a signal to be filtered (a forward signal) and a reverse version of the signal to be filtered (a reverse signal), and having as an output a filtered signal as a function of a variable coefficient; and
   a variable equivalent sample rate coefficient converter having an initial coefficient as an input together with a variable resampling rate parameter that determines the variable passband, and providing as an output the variable coefficient as a function of the variable resampling rate parameter;
   wherein the filter circuit comprises:
   a first IIR filter having the forward signal and the variable coefficient as inputs, and providing as an output a first filtered signal;
   a second IIR filter having the reverse signal and the variable coefficient as inputs, and providing as an output a second filtered signal; and
   means for combining the first and second filtered signals with the forward signal to provide the filtered signal;
   wherein the combining means comprises a summing circuit having as inputs the first and second filtered signals and the forward signal, and providing as an output the filtered signal; and
   wherein each IIR filter comprises:
   a gain stage having an input coupled to receive an input signal, and providing an output in response to a gain component of the variable coefficient; and
   a decay stage having an input coupled to the output of the gain stage, and providing as an output a filtered input signal in response to a decay component of the variable coefficient.

2. The filter as recited in claim 1 wherein the variable equivalent sample rate coefficient converter comprises:
   an asymmetric variable equivalent sample rate coefficient converter having as inputs the variable resampling parameter and a gain component of the initial coefficient, and providing as an output the gain component of the variable coefficient; and
   a symmetric variable equivalent sample rate coefficient converter having as inputs the variable resampling parameter and a decay component of the initial coefficient, and providing as an output the decay component of the variable coefficient.

3. A filter having a variable passband comprising:
   a filter circuit having as inputs a signal to be filtered (a forward signal) and a reverse version of the signal to be filtered (a reverse signal), and having as an output a filtered signal as a function of a variable coefficient; and
   a variable equivalent sample rate coefficient converter having an initial coefficient as an input together with a variable resampling rate parameter that determines the variable passband, and providing as an output the variable coefficient as a function of the variable resampling rate parameter;

wherein the filter circuit comprises:

a first IIR filter having the forward signal and the variable coefficient as inputs, and providing as an output a first filtered signal;

a second IIR filter having the reverse signal and the variable coefficient as inputs, and providing as an output a second filtered signal; and means for combining the first and second filtered signals with the forward signal to provide the filtered signal;

wherein the combining means comprises:

an input multiplier having as inputs the forward signal and an all pass gain coefficient derived from the variable coefficient and the variable resampling rate parameter, and providing an output;

a summing circuit having as inputs the first and second filtered signals and the output from the input multiplier, and providing as an output a preliminary filtered signal; and an output multiplier having as inputs the preliminary filtered signal and a gain correction coefficient to provide overall gain for the filter, and providing as an output the filtered signal.

4. The filter as recited in claim 3 wherein the variable coefficient input to the first and second IIR filters is a decay component of the variable coefficient.

5. A filter having a variable passband comprising:

a filter circuit having as inputs a signal to be filtered (a forward signal) and a reverse version of the signal to be filtered (a reverse signal), and having as an output a filtered signal as a function of a variable coefficient; and a variable equivalent sample rate coefficient converter having an initial coefficient as an input together with a variable resampling rate parameter that determines the variable passband, and providing as an output the variable coefficient as a function of the variable resampling rate parameter;

wherein the filter circuit comprises:

a first IIR filter having the forward signal and the variable coefficient as inputs, and providing as an output a first filtered signal;

a second IIR filter having the reverse signal and the variable coefficient as inputs, and providing as an output a second filtered signal; and means for combining the first and second filtered signals with the forward signal to provide the filtered signal; and wherein the variable coefficient input to the first and second IIR filters is a decay component of the variable coefficient.

* * * * *